United States Patent
Jagannathan et al.

(10) Patent No.: US 9,865,730 B1
(45) Date of Patent: Jan. 9, 2018

(54) VTFET DEVICES UTILIZING LOW TEMPERATURE SELECTIVE EPITAXY

(71) Applicant: INTERNATIONAL BUSINESS MACHINES CORPORATION, Armonk, NY (US)

(72) Inventors: Hemanth Jagannathan, Niskayuna, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/338,653

(22) Filed: Oct. 31, 2016

(51) Int. Cl.
| | | |
|---|---|---|
| *H01L 21/84* | (2006.01) | |
| *H01L 29/78* | (2006.01) | |
| *H01L 29/66* | (2006.01) | |
| *H01L 21/02* | (2006.01) | |
| *H01L 21/306* | (2006.01) | |
| *H01L 29/167* | (2006.01) | |
| *H01L 29/08* | (2006.01) | |

(52) U.S. Cl.
CPC .... *H01L 29/7827* (2013.01); *H01L 21/02532* (2013.01); *H01L 21/02595* (2013.01); *H01L 21/02598* (2013.01); *H01L 21/30604* (2013.01); *H01L 29/0847* (2013.01); *H01L 29/167* (2013.01); *H01L 29/66666* (2013.01); *H01L 29/785* (2013.01)

(58) Field of Classification Search
CPC .......... H01L 27/088; H01L 29/66666; H01L 29/7883; H01L 29/7889; H01L 29/66825; H01L 21/823418; H01L 21/823487; H01L 21/823814; H01L 27/092; H01L 29/1608; H01L 29/161; H01L 29/7851
USPC ......... 257/288, 368, 369; 438/151, 197, 199
See application file for complete search history.

(56) References Cited

U.S. PATENT DOCUMENTS

| | | | |
|---|---|---|---|
| 8,399,314 B2 | 3/2013 | Cohen et al. | |
| 9,112,027 B2 | 8/2015 | Shimamune et al. | |
| 9,142,643 B2 | 9/2015 | Cheng et al. | |
| 2013/0040438 A1 | 2/2013 | Adam et al. | |
| 2013/0040440 A1 | 2/2013 | Adam et al. | |
| 2014/0170840 A1* | 6/2014 | Tsai ........................ | H01L 29/68 438/492 |

(Continued)

FOREIGN PATENT DOCUMENTS

| | | |
|---|---|---|
| JP | 2001326351 A | 11/2001 |
| JP | 2002289834 A | 10/2002 |
| JP | 2003243410 A | 8/2003 |

*Primary Examiner* — Shahed Ahmed
(74) *Attorney, Agent, or Firm* — Cantor Colburn LLP; Vazken Alexanian

(57) ABSTRACT

Low temperature epitaxial silicon deposition for forming the top source or drain regions of VTFET structures. The methods generally include epitaxially growing a silicon layer with a dopant at a temperature less 500° C. on a first surface and an additional surface to form a single crystalline silicon on the first surface and a polysilicon or amorphous silicon on the additional surface. The epitaxially grown silicon layer is then exposed to an etchant include HCl and germane at a temperature less than 500° C. for a period of time effective to selectively remove the polysilicon/amorphous silicon on the additional surface and form a germanium diffused region on and in an outer surface of the single crystalline silicon formed on the first surface.

16 Claims, 7 Drawing Sheets

(56) References Cited

U.S. PATENT DOCUMENTS

2014/0252481 A1* 9/2014 Flachowsky ...... H01L 29/42392
　　　　　　　　　　　　　　　　　　　　　257/349

* cited by examiner

VTFET DEVICES UTILIZING LOW TEMPERATURE SELECTIVE EPITAXY

BACKGROUND

The present invention relates in general to semiconductor device fabrication methods and resulting structures. More specifically, the present invention relates to fabrication methods and resulting semiconductor device structures including a vertical transport field effect transistor.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and performance over lateral devices. Vertical transport field effect transistors (VTFET) are one of the promising alternatives to standard lateral FET structures due to benefits, among others, in terms of reduced circuit footprint. In this type of structure, the current flow is perpendicular to a supporting wafer, unlike the lateral current flow in FinFETs.

SUMMARY

According to one or more embodiments of the present invention, a method for forming a semiconductor structure is provided. The method includes providing a substrate including a first surface including single crystalline silicon and at least one additional surface including a dielectric material. A silicon layer with a dopant is epitaxially grown on the substrate at a temperature less 500° C. to form a single crystalline silicon on the first surface and a polysilicon/amorphous silicon on the additional surface. The epitaxially grown silicon layer is exposed to an etchant, which includes HCl and germane at a temperature less than 500° C. for a period of time effective to selectively remove the polysilicon/amorphous silicon on the additional surface and form a germanium diffused region on and in an outer surface of the single crystalline silicon formed on the first surface.

In one or more embodiments, a method of forming a top source or drain region in a VTFET device includes positioning a semiconductor substrate including a partial VTFET structure in an epitaxially deposition chamber. The partial VTFET structure includes a substrate, a bottom doped source or drain region, a vertically oriented channel region extending from the bottom doped source or drain region, a gate stack over the channel region and between a bottom spacer overlying a portion of the bottom doped source and drain region and a top spacer. A deposition surface of the partial VTFET structure includes a dielectric material and a topmost portion of the channel region. First source gases are applied for deposition of a material layer to the deposition surface at a temperature of less than 500° C. The first source gases include a phosphorous containing gas and a silicon containing gas selected from the group consisting of $SiH_4$, $Si_2H_6$, $Si_3H_8$ and $Si_4H_{10}$. A doped polysilicon/amorphous silicon layer is formed on the dielectric material and a doped single crystalline silicon layer is formed on the exposed topmost portion of the channel region. Second source gases are applied for surface modification and etching. The second source gasses include HCl and germane. Surface modification selectively diffuses germanium atoms into a portion of the polysilicon/amorphous silicon to render the germanium atom diffused portion removable upon contact with the HCl etchant so as to selectively remove the portion of the doped polysilicon/amorphous silicon layer relative to the doped single crystalline silicon and form the top source or drain region in the VTFET device.

In one or more embodiments, a VTFET structure includes a top source or drain region of a doped single crystalline silicon including a germanium atom diffused region formed in an outer surface of the top source or drain region extending from a vertically oriented channel region of a fin structure, wherein the vertically oriented channel region extends between a bottom source or drain region and the top source or drain region.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
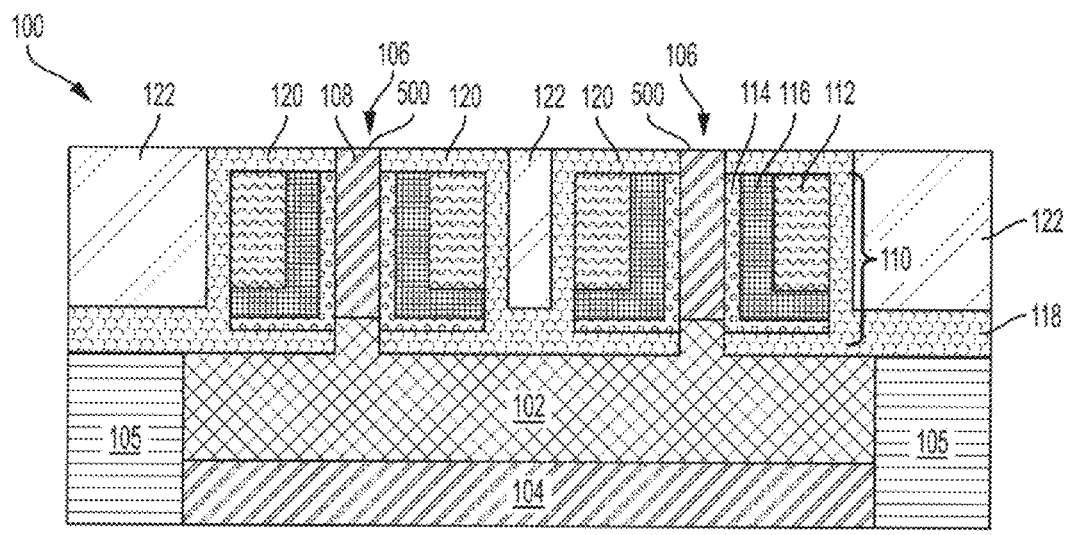
FIG. 1 depicts a cross-sectional view of a VTFET structure up to formation of a top source or drain region according to one or more embodiments of the present invention.

The present invention is generally directed to VTFET structures and methods to form VTFET structures using non-selective low temperature deposition of a doped silicon to form the top source/drain for the VTFET structure. As will be described in greater detail below, the method and resulting VTFET structure generally includes surface modification of the non-selective deposited silicon followed by etching. Surface modification and etching utilizes exposing the surface to a gaseous mixture of HCl and germane ($GeH_4$) at a relatively low temperature of less than 500° C. Advantageously, the surface modification and etching can be done in the same epitaxial chamber as the non-selective deposition of silicon.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising", "includes", "including", "has," "having", "contains" or "containing", or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment", "an example embodiment", etc., indicate that the embodiment described can include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right", "left", "vertical", "horizontal", "top", "bottom", and derivatives thereof shall relate to the described structures and methods, as oriented in the drawing figures. The terms "overlying", "atop", "on top", "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to", such as, for example, "a first element selective to a second element", means that a first element can be etched and the second element can act as an etch stop.

For the sake of brevity, conventional techniques related to semiconductor device and integrated circuit (IC) fabrication are not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device utilizing a non-selective low temperature deposition process for forming the top source/drain in a VTFET device according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some non-planar transistor device architectures, such as vertical transport field effect transistors (VTFETs), employ semiconductor fins and side-gates that can be contacted outside the active region, resulting in increased device density and performance over lateral devices.

Methods including a non-selective low temperature deposition process to form a top source/drain region of a VTFET structure and the resulting structures therefrom in accordance with embodiments of the present invention are described in detail below by referring to the accompanying drawings in FIGS. 1-10. In addition to the low temperature deposition process, the methods include surface modification and selective etching of the deposited doped polysilicon and/or amorphous silicon relative to the deposited doped single crystalline silicon of the top source/drain.

FIG. 1 illustrates a cross-sectional view representative of a VTFET structure 100 up to formation of a top source or drain module (hereinafter referred to as "source/drain"). It should be apparent that the present invention is not limited to this particular structure nor is it intended to be limited to any particular method for forming the VTFET up to formation of the top source/drain module. One of ordinary skill in the art will recognize that the VTFET structure immediately prior to the top source/drain module can include a planar surface, or alternatively, can include topography.

The VTFET structure 100 up to formation of a top source/drain module generally includes the following components as shown in FIG. 1. First, the structure 100 includes a bottom epitaxy region 102 formed on a substrate 104, wherein the bottom epitaxy region is doped to define the bottom source or drain region. The doping of the bottom epitaxy region 102 can be configured as a source or drain region formed in the substrate 104 by a variety of methods, such as, for example, diffusion and/or ion implantation.

The substrate 104 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 104. In one or more embodiments and when substrate 104 is a remaining semiconductor material portion of a bulk semiconductor substrate, the substrate 104 can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. In some embodiments and when substrate 104 is a remaining semiconductor material portion of a bulk semiconductor substrate. As will be described in greater detail below, each semiconductor fin can include the same semiconductor material, or a different semiconductor material, from substrate 104.

In another embodiment, substrate 104 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 104 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate 104 can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multi-layered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate can have a thickness from 1 nm to 200 nm. Other thicknesses that are lesser than, or greater than, the aforementioned thickness range can also be employed as the insulator layer.

The first exemplary semiconductor structure shown in FIG. 1 can be formed by first providing a bulk semiconductor substrate (as defined above) or a SOI substrate (as defined above). Adjacent devices formed on the substrate CAN be separated by shallow trench isolation regions 105. The shallow trench isolation regions 105 can be created early during the semiconductor device fabrication process, e.g., before the transistors such as the illustrated VTFET are formed. The key steps for forming the shallow trench isolation regions 105 typically involve etching a pattern of trenches in the substrate 104, depositing one or more dielectric materials (such as silicon dioxide) to fill the trenches, and removing the excess dielectric using a technique such as chemical-mechanical planarization.

A vertically oriented semiconductor fin 106 is formed on and coupled to the bottom epitaxy region 102. Any known composition and manner of forming the semiconductor fin 106 can be utilized. In one or more embodiments, a patterned hard mask (not illustrated) is etched to expose portions of the substrate 104. The exposed portions of the substrate 104 can be removed to form a plurality of semiconductor fins, two of which are shown. The patterned hard mask is then removed, by either wet or dry etch processes.

A gate stack 110, including a gate metal 112, a high k dielectric region 114 and a work function metal 116 is formed over a channel region 108 of the semiconductor fin 106. Any known composition and manner of forming the gate stack 110 can be utilized. The gate stack 110 can be made of, for example, tungsten (W), titanium nitride (TiN), or the like during an operation for forming a VTFET. In some embodiments, a high-k dielectric region 114 is formed between the gate stack 110 and the semiconductor fin 106 to modify the work function of the gate stack 110. The high-k dielectric region 114 can be made of a binary or ternary high-k dielectric film, for example, $HfO_2$, $La_2O_3$, $Al_2O_3$, $TiO_2$, $HfSiO_4$, $LaAlO_3$ etc.

In some embodiments, a bottom spacer 118 is formed between the gate stack 110 and the bottom epitaxy region 102. The bottom spacer 118 can be any suitable material, such as, for example, a low k nitride, silicon nitride (SiN), silicon oxygen carbonitride (SiOCN), or silicoboron carbonitride (SiBCN). In some embodiments, a spacer 120 that can function as a hard mask can be formed overlying the semiconductor fin 106. The spacer 120 can be any suitable material, such as, for example, SiN and can be the same or different from the bottom spacer 118.

The structure 100 further includes an interlayer dielectric layer (ILD) 122. Any known composition and manner of forming the ILD 122 can be utilized. By way of example, the ILD can include any dielectric material including inorganic dielectrics or organic dielectrics. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD can be deposited by spin on processes, PECVD processes or the like as is generally known in the art. In still other embodiments, a chemical-mechanical planarization (CMP) selective to the top spacer 118 is used to remove any excess portion of the ILD (known as overburden).

As shown, a surface of the semiconductor fin 106 is exposed. Any known manner of exposing the surface can be utilized. In some embodiments, a directional etch back exposes the surface 500.

Figure 2:
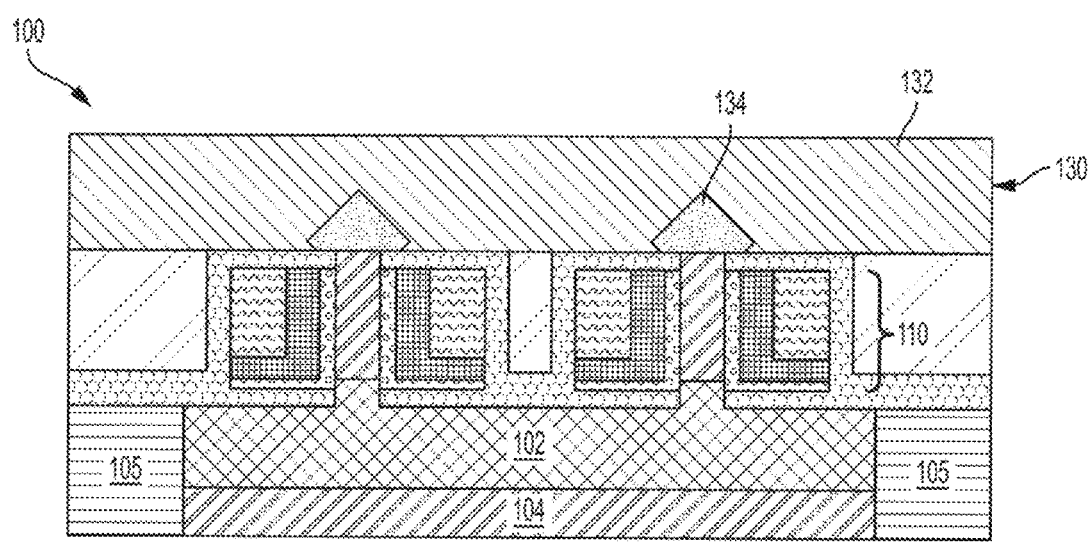
FIG. 2 depicts the cross-sectional view of the VTFET structure after low temperature deposition of a doped silicon layer on the VTFET structure of FIG. 1, wherein doped polysilicon/amorphous silicon is formed on a dielectric surface and doped single crystalline silicon is formed on a channel region surface according to one or more embodiments of the present invention.

Referring now to FIG. 2, there is shown a cross-sectional view of the structure 100 subsequent to non-selective low temperature deposition of phosphorous doped silicon layer. Low temperature deposition at temperatures of less than 500° C. is generally desired due to the thermal budget limitations for the advanced gate stack materials. However, as noted above, low temperature deposition is generally non-selective and utilizes silicon containing precursors such as $SiH_4$, $Si_2H_6$, $Si_3H_8$, $Si_4H_{10}$ and the like for silicon growth. For phosphorous doping, $PH_3$ can be used as the gas source. The non-selective low temperature growth process can be used to form a phosphorous doped semi-crystalline (i.e., polysilicon) and/or a phosphorous doped non-crystalline amorphous silicon (referred to herein as "poly/amorphous silicon") on the dielectric surfaces, e.g., 122, 120, and a phosphorous doped single crystalline silicon on the exposed surfaces of the channel region 108 of the fin structure 106. Because of the growth rate difference in different crystal orientations, a multifaceted top source/drain region of the single crystalline silicon on the channel 108 is formed, which is depicted as diamond shaped.

One of the problems associated with low temperature process to achieve selective epitaxy is that the etch rate of the poly/amorphous layers is significantly reduced. Moreover, the etch rate difference between the poly/amorphous silicon and the single crystalline single is about the same.

Figure 3:
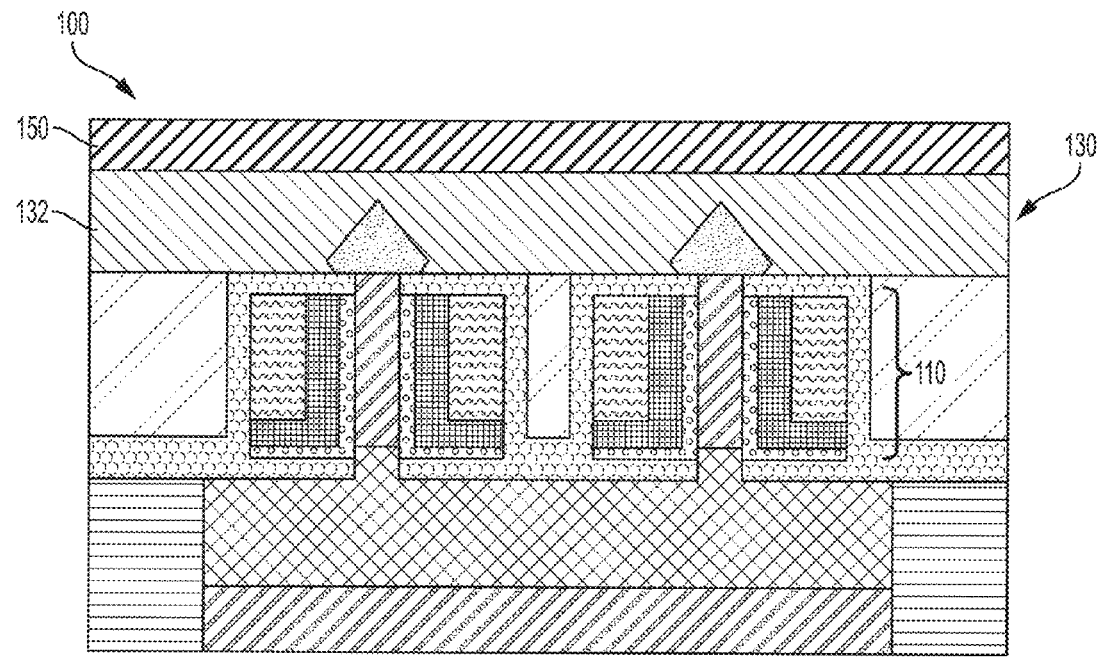
FIG. 3 depicts the cross-sectional view of the VTFET structure of FIG. 2 after exposing the substrate to a gaseous mixture of HCl and germane to selectively modify a portion of the doped polysilicon/amorphous silicon according to one or more embodiments of the present invention.

In FIG. 3, there is depicted a cross-sectional view of the substrate 100 after surface modification of a portion 150 of the poly/amorphous silicon layer 132. Modification of the portion 150 is effected by exposure in the epitaxial chamber to a cold flow process of a gaseous mixture including HCl and germane ($GeH_4$) at a temperature of less than 500° C. It has been found that the germanium atoms provided from the gaseous mixture diffuse into the poly/amorphous silicon layer at a markedly higher rate than the single crystalline silicon, which is very small. Moreover, the germanium atoms diffuse into a fraction of the poly/amorphous silicon layer after which the modified surface is susceptible to HCl etching from the HCl present in the gaseous mixture. Without diffusion of the germanium atoms into portion 150 of the poly/amorphous silicon layer 132, the poly/amorphous silicon layer is resistant to HCl etch. That is, it is only after the surface has been modified upon exposure to germane that the etching rate is markedly increased. The HCl etching rate of silicon by itself, whether it be polysilicon, amorphous silicon or single crystalline silicon, is minimal, i.e., close to zero.

The surface modification and etching process generally depends on temperature, pressure, time, ratio of HCl to germane, phosphorous doped concentration in the silicon, and the like. Modification of these parameters is well within the ordinary skill of those in the art.

Figure 4:
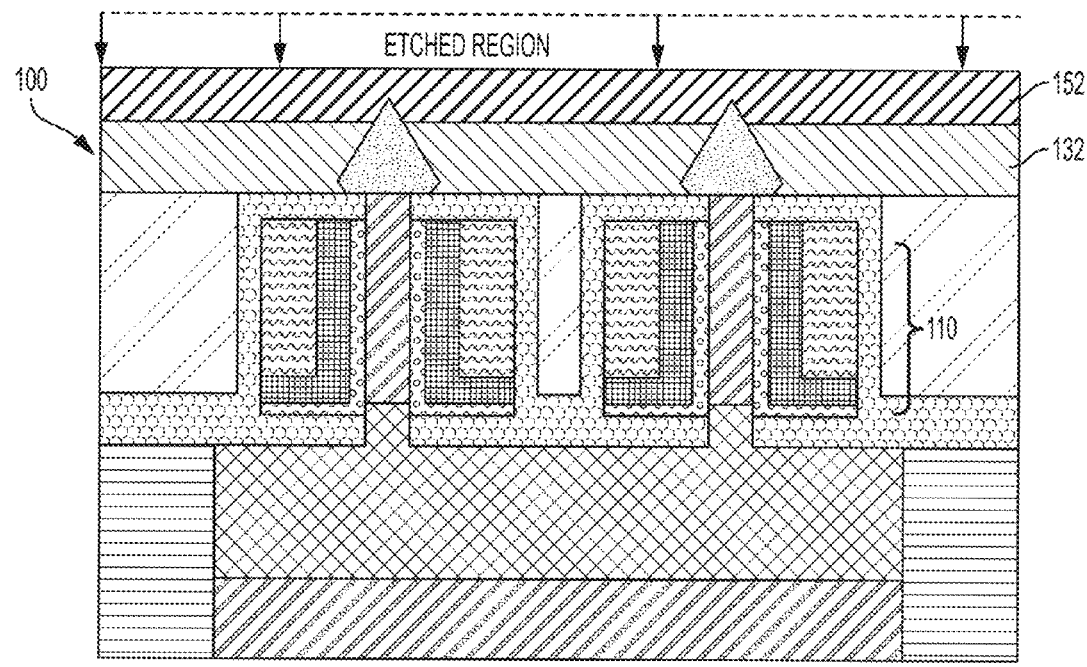
FIG. 4 depicts the cross-sectional view of the VTFET structure of FIG. 3 after continued exposure of the substrate to the gaseous mixture of HCl and germane to selectively etch the modified portion and selectively modify an additional portion of the doped polysilicon/amorphous silicon according to one or more embodiments of the present invention.

In FIG. 4, a cross sectional view of the structure 100 is provided subsequent to diffusion of germanium atoms into the poly/amorphous layer and concomitant exposure to the gaseous HCl at temperatures less than 500° C., which results in removal of the germanium diffused portion 150 of the poly/amorphous layer 132 as indicated by the dotted line etched region shown in FIG. 4. In addition, the germane present in the gaseous mixture provides germanium atoms that diffuse into another portion 152 poly/amorphous silicon layer 132.

Figure 5:
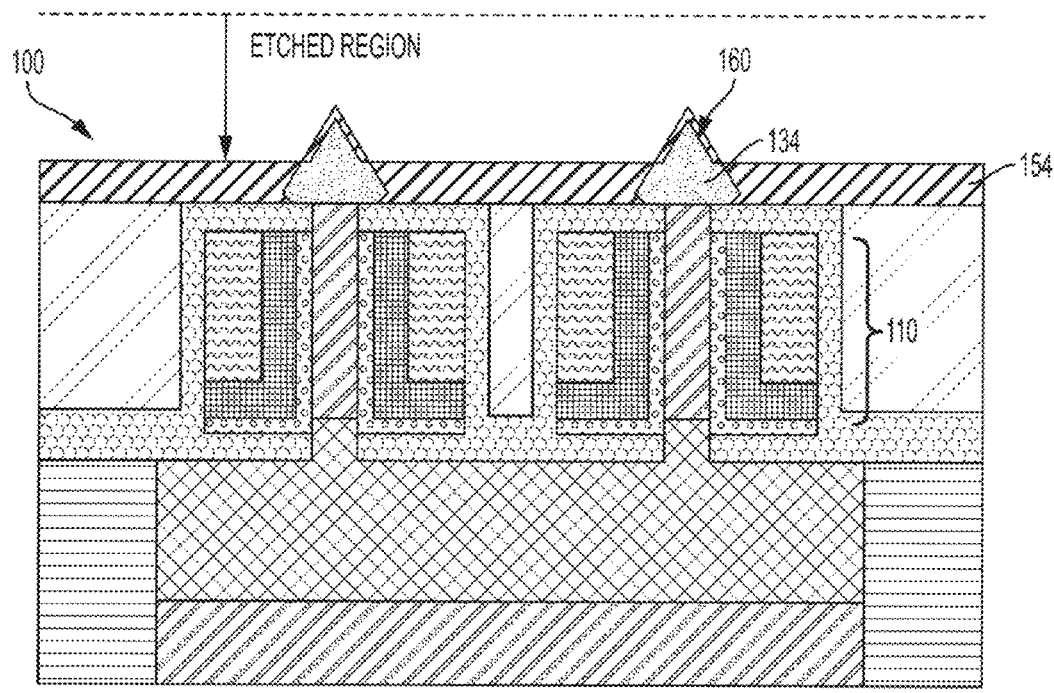
FIG. 5 depicts the cross-sectional view of the VTFET structure of FIG. 4 after continued exposure of the substrate to the gaseous mixture of HCl and germane to selectively etch the additional modified portion and selectively modify a remaining portion of the doped polysilicon/amorphous silicon according to one or more embodiments of the present invention.

In FIG. 5, there is depicted a cross-sectional view of the substrate 100 after removal of the portion 152 and surface modification with germanium atoms in the remaining portion 154 of the poly/amorphous silicon layer 132. A small amount of germanium on the order of a few Angstroms as indicated by reference numeral 160 diffuses into the exposed surfaces of the phosphorous doped single crystalline silicon. As shown, the phosphorous doped single crystalline silicon 134 that defines the top source or drain region provides limited germanium atom diffusion into the crystalline structure. In contrast, germanium atom diffusivity into the poly/amorphous silicon layer 132 is markedly higher, which permits selective etch to occur so as to remove the poly/amorphous silicon layer 132 relative to the single crystalline silicon 134. The presence of the germanium atoms in the crystalline silicon provides detectability; especially for structures including multiple germanium atom diffused crystalline silicon layers.

Figure 6:
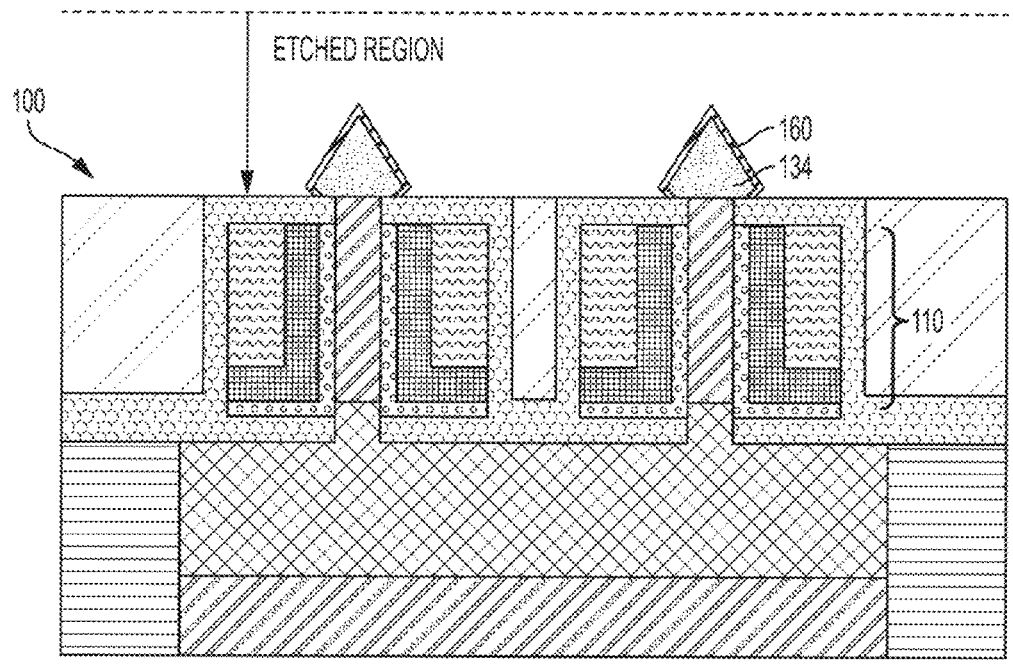
FIG. 6 depicts the cross-sectional view of the VTFET structure of FIG. 5 after continued exposure of the substrate to the gaseous mixture of HCl and germane to selectively etch the remaining modified portion of the polysilicon/amorphous silicon according to one or more embodiments of the present invention.

In FIG. 6, there is depicted a cross-sectional view of the substrate 100 after selective etching of the remaining fraction 154 of the poly/amorphous silicon layer 132.

Figure 7:
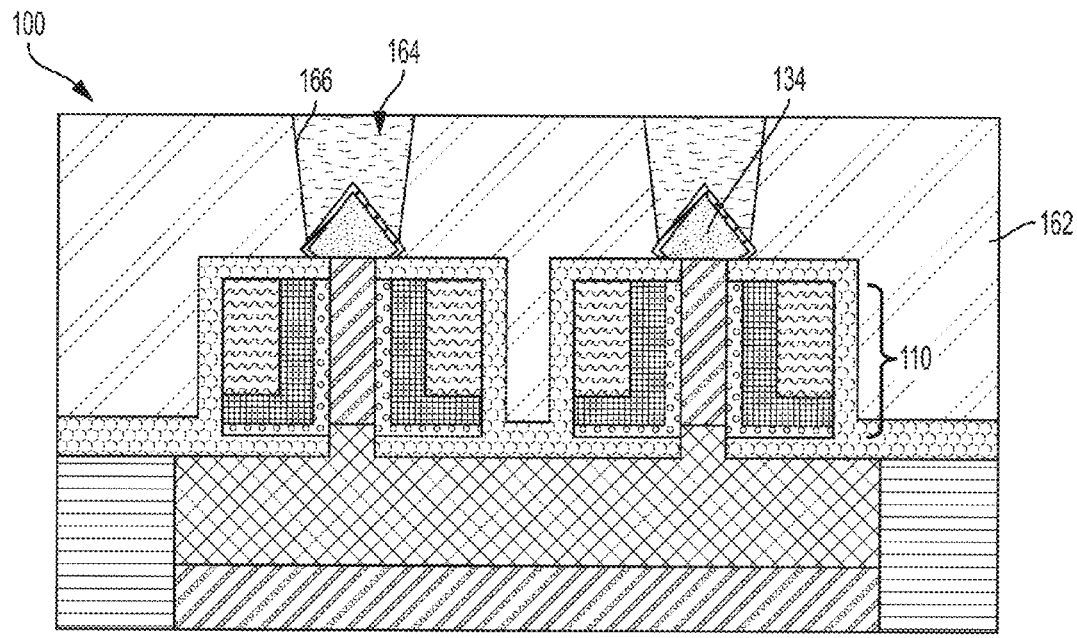
FIG. 7 depicts the cross-sectional view of the of the VTFET structure of FIG. 6 subsequent to interlayer dielectric deposition and formation of contacts to the top source or drain regions according to one or more embodiments of the present invention.

In FIG. 7, there is depicted a cross-sectional view of the substrate 100 subsequent to deposition of an ILD 162 and formation of contacts 164 to the VTFET formed on the substrate 100. By way of example, the contact opening 166 can formed by optical lithography and etching. The lithographic step can include forming a photoresist (organic, inorganic or hybrid) atop the substrate 100. In one or more embodiments, the photoresist can be formed directly on the upper surface of the substrate 100. The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, an etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof. The contact opening is then filled with a conductive material so as to electrically connect to the top source/drain region of the fin 106.

Figure 8:
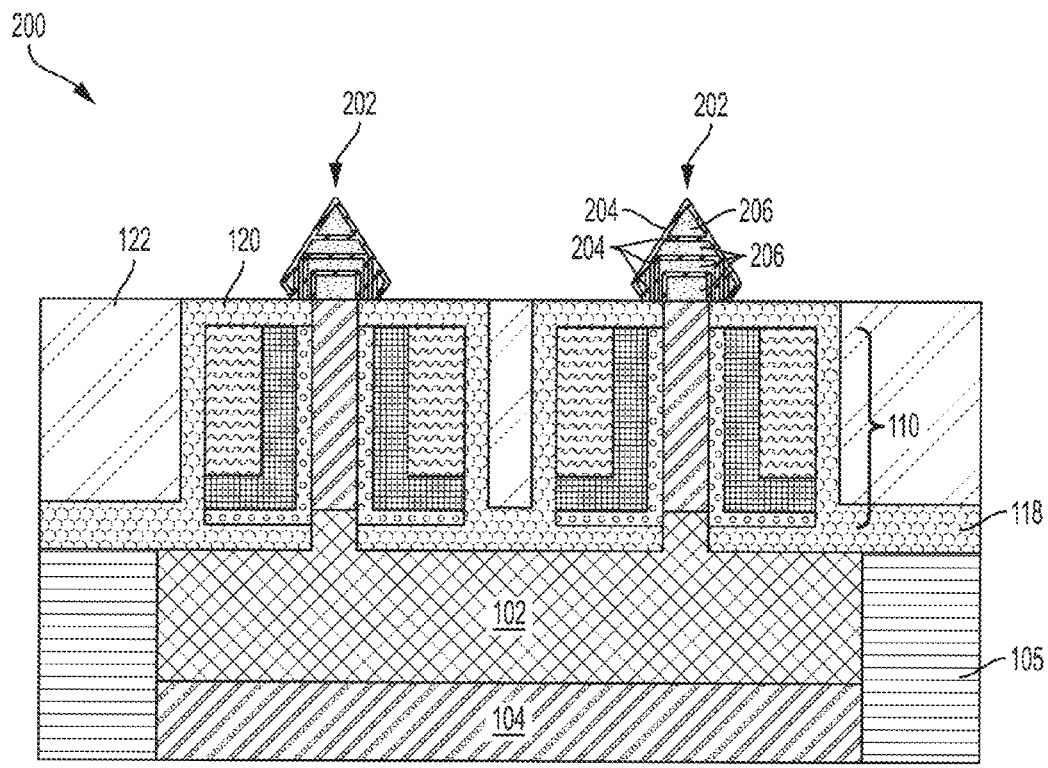
FIG. 8 depicts a cross-sectional view of the VTFET structure of FIG. 1 after cycling of the low temperature deposition of a doped silicon layer on the VTFET structure of FIG. 1 and the exposure of the substrate to the gaseous mixture of HCl and germane according to one or more embodiments of the present invention.

Referring now to FIG. 8, there is shown a cross section of a VTFET structure 200 in accordance with one or more embodiments. The formation of the VTFET structure 200 up to formation of a top source/drain module can be as generally described above in FIG. 1 As shown, the top source or drain region 202 includes one or more layers of a germanium atom diffused regions 204 and single crystalline silicon 206. Low temperature non-selective deposition of silicon as described above can be cycled with the surface modification/etch process as described above. The length of the individual cycles can be used to control the thickness of each respective layer 204, 206. Moreover, unlike the process described above, because the deposition and etch processes are cycled, the thickness of the germanium diffused region can be markedly thinner.

By way of example, the non-selective low temperature deposition process can be configured to deposit a first thickness of silicon onto the VTFET structure 200 followed by a low temperature surface modification/etch process utilizing a gaseous mixture of germane and HCl, which forms a relative thin layer of germanium diffused region on the single crystalline silicon while diffusing to a markedly higher degree into the poly/amorphous silicon, a portion of which is removed by exposure to the HCl gas. The process is cycled to provide low temperature epitaxial deposition of an additional layer of silicon at a second thickness, which can then be subjected to low temperature surface modification/etching utilizing the germane and HCl gaseous mixture as previously described. The deposition-etch cyclic process can be repeated multiple times as desired. The resulting VTFET structure 200 including the top source or drain regions with multiple thin layers of germanium diffused regions with the single crystalline silicon.

Figure 9:
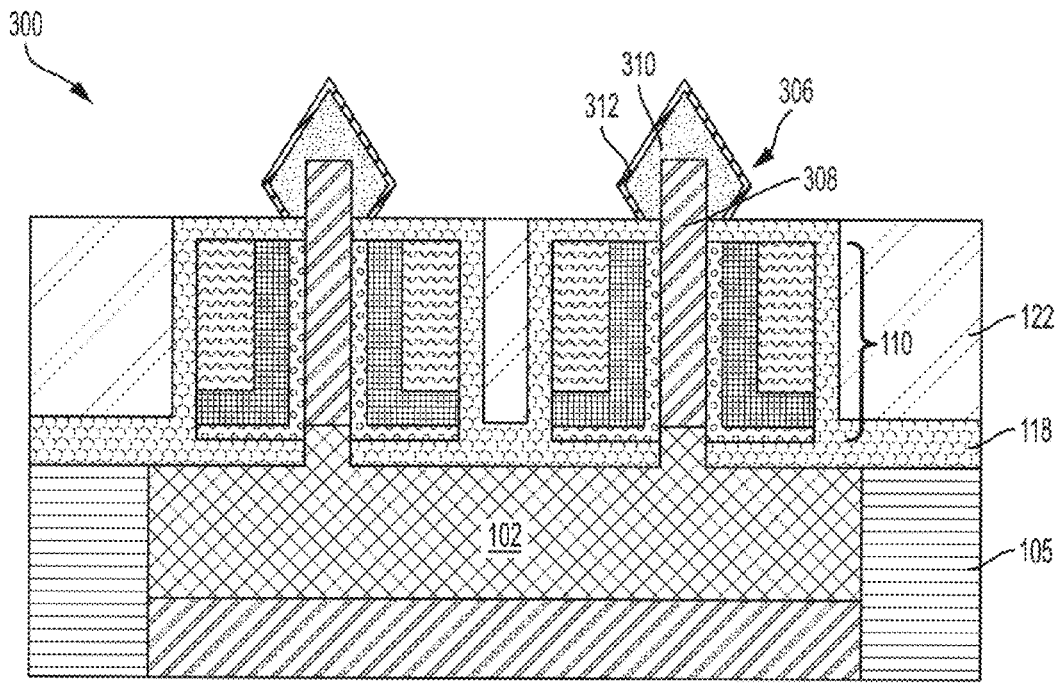
FIG. 9 depicts a cross-sectional view of the VTFET structure of FIG. 1 including a channel region extending beyond a dielectric surface, wherein the depicted VTFET structure is after a single cycle of low temperature deposition of a doped silicon layer and the exposure of the substrate to the gaseous mixture of HCl and germane according to one or more embodiments of the present invention.

Referring now to FIG. 9, there is a cross-sectional view of a VTFET structure 300 in accordance with one or more embodiments. The formation of the VTFET structure 300 up to formation of a top source/drain module can be as generally described above in FIG. 1 with the exception that the channel region 308 of the fin structure 306 extends above a plane defined by the top spacer 120 and the interlayer dielectric 122. As shown, the top source or drain region 310 includes a single layer of a germanium atom diffused region 312. Formation of the single layer of the germanium diffused region 312 can be formed in a manner similar to that discussed in relation to FIGS. 1-7. That is, non-selective phosphorous doped silicon is grown on the top most surface of the VTFET structure followed by exposure to a gaseous mixture of HCl and germane at the low temperature of less than 500° C. Single crystalline silicon 310 is formed on the exposed surfaces of the channel region 308 and poly/amorphous silicon (not shown) is formed on the dielectric surfaces 120, 122. Low temperature surface modification/etching utilizing the germane and HCl gaseous mixture selectively removes the poly/amorphous silicon as previously described and forms a germanium diffused region 312 on the single crystalline silicon 310.

Figure 10:
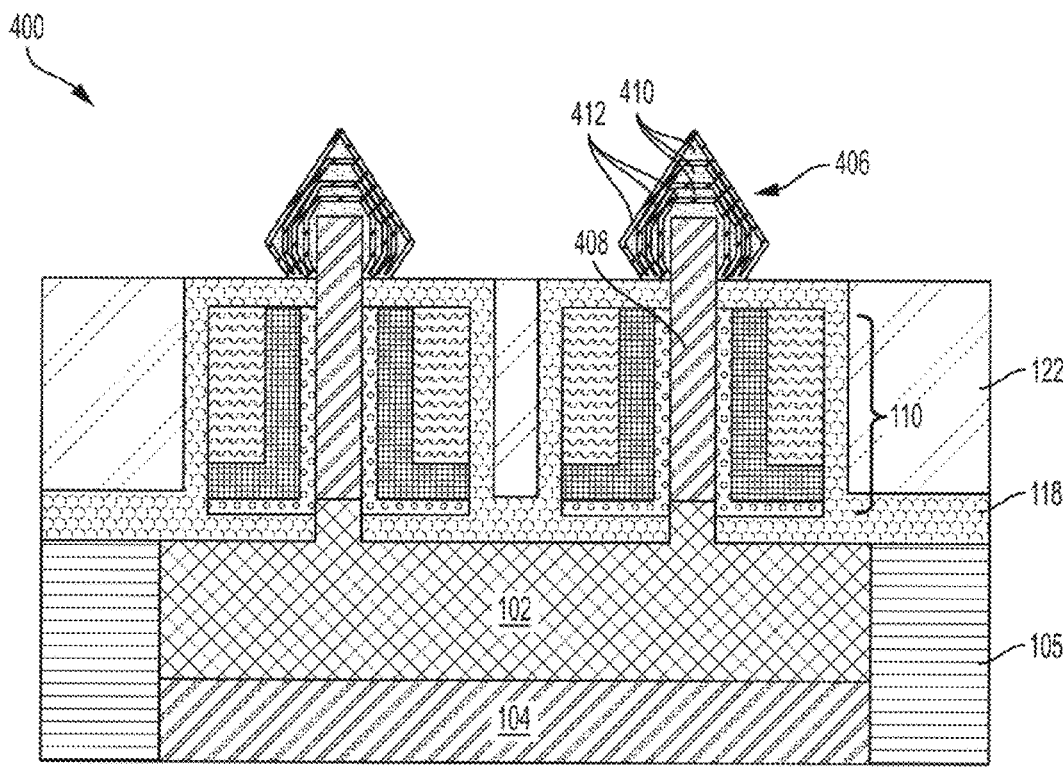
FIG. 10 depicts a cross-sectional view of the VTFET structure of FIG. 1 including a channel region extending beyond a dielectric surface, wherein the depicted VTFET structure is after cycling of the low temperature deposition of a doped silicon layer and the exposure of the substrate to the gaseous mixture of HCl and germane according to one or more embodiments of the present invention.

In FIG. 10, there is shown a cross-sectional view of a VTFET structure 400 in accordance with one or more embodiments. The formation of the VTFET structure 400 up to formation of a top source/drain module can be as generally described above in FIG. 1 with the exception that the channel region 408 of the fin structure 406 extends above a plane defined by the top spacer 120 and the interlayer dielectric 122. As shown, the top source or drain region 406 includes multiple layers of a germanium atom diffused region 412. Formation of the multiple layer of the germanium diffused region 412 can be formed in a manner similar to that discussed in relation to FIG. 8. That is, non-selective deposition of phosphorous doped silicon and surface modification/etching with a gaseous mixture of HCl and germane is repeatedly cycled at the low temperature of less than 500° C. Single crystalline silicon 410 with multiple layers of a germanium diffused region is formed on the exposed surfaces of the channel region 408 and the poly/amorphous silicon (not shown) is removed.

Figure 11:
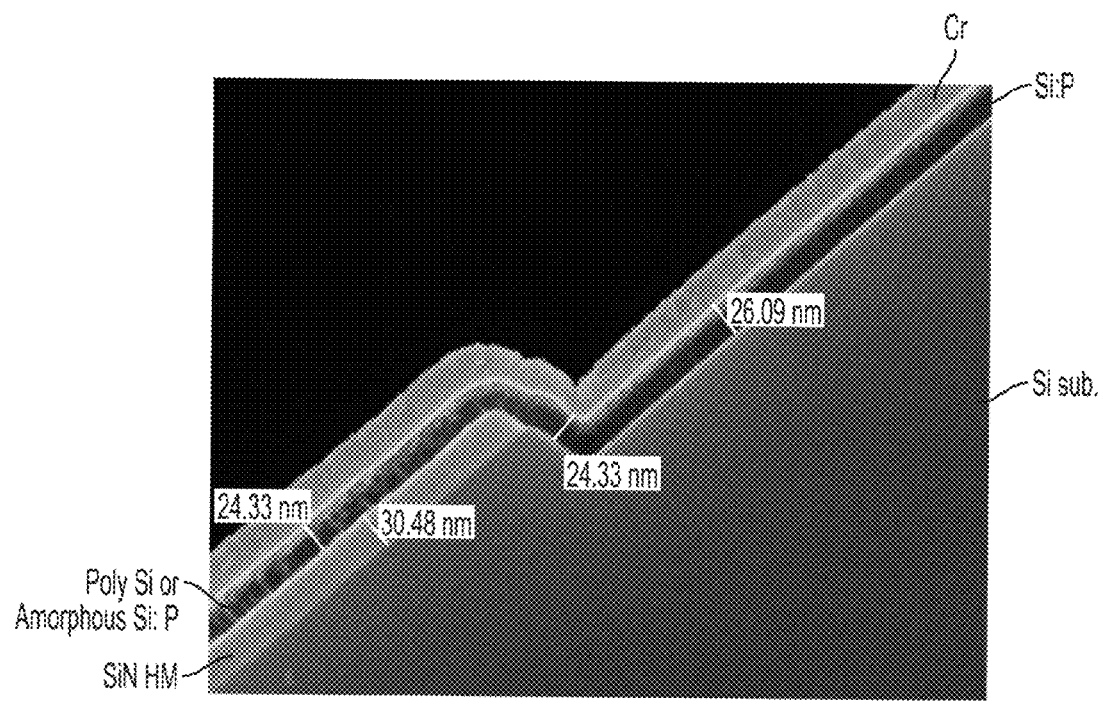
FIG. 11 depicts a photomicrograph of a phosphorous doped silicon layer deposited onto a silicon substrate and a silicon nitride hard mask layer by low temperature deposition according to one or more embodiments of the present invention.

Referring now to the scanning electron micrographs 11-16, there are illustrated cross sections of the phosphorous doped silicon layer formed by low temperature non-selective deposition. As shown in FIG. 11, phosphorous doped polysilicon or amorphous silicon is formed on a silicon nitride hard mask whereas phosphorous doped single crystalline silicon is formed on the single crystalline silicon substrate. The thickness of the deposited silicon layer is relatively uniform, wherein the single crystalline silicon had a thickness of about 26 nanometers (nm) and the polysilicon had a thickness of about 24 nm.

Figure 12:
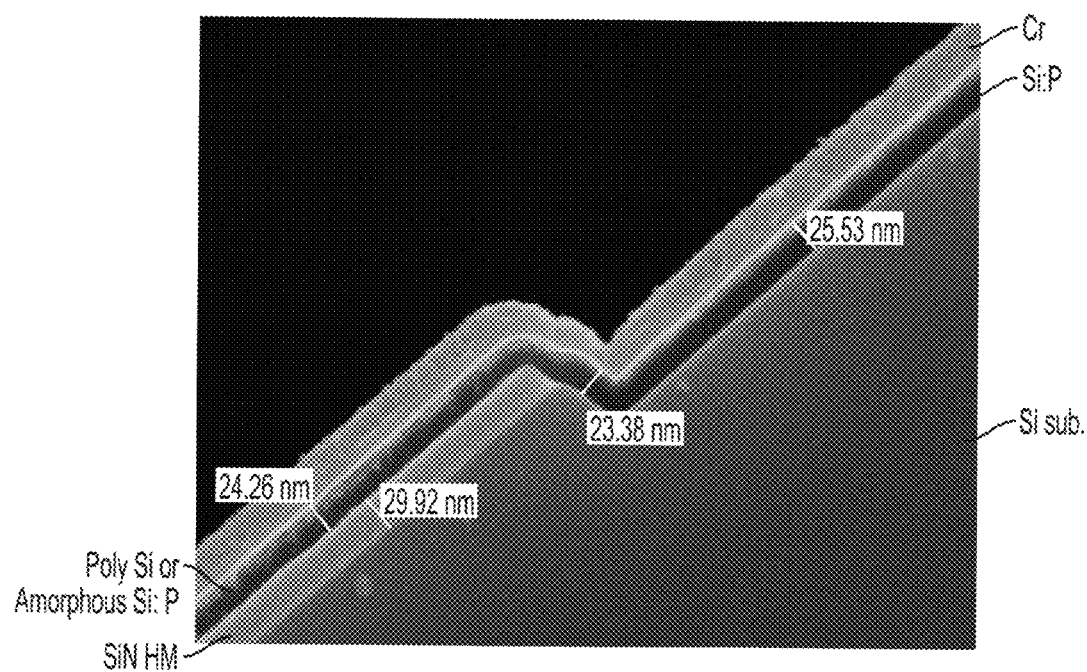
FIG. 12 depicts the phosphorous doped silicon layer of FIG. 11 deposited onto the silicon substrate and a silicon nitride hard mask layer subsequent to exposure to an HCl etchant according to one or more embodiments of the present invention.

FIG. 12 illustrates the phosphorous doped silicon layer of FIG. 11 subsequent to exposure to gaseous HCl etchant in the epitaxial chamber. As shown, the epitaxial phosphorous doped silicon layer was substantially resistant to the HCl etchant. The thickness of the single crystalline silicon had a thickness of about 25.5 nm after exposure to the HCl etchant compared to an initial epitaxial deposition thickness of about 26 nanometers (nm). Similarly, the polysilicon or amorphous silicon had a thickness of about 24 nm after exposure to the HCl etchant compared to an initial thickness of about the same.

Figure 13:
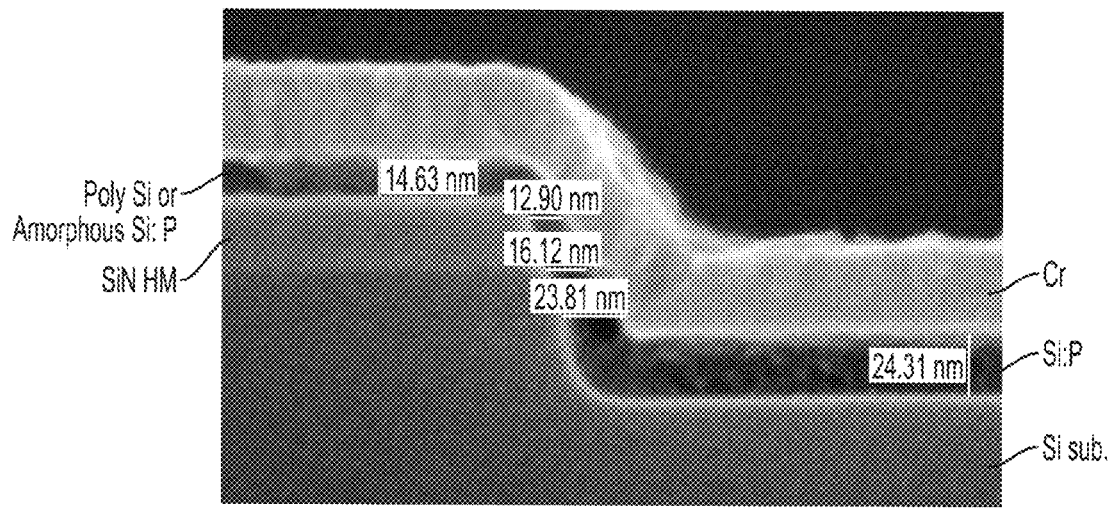
FIG. 13 depicts the phosphorous doped silicon layer of FIG. 11 deposited onto the silicon substrate and a silicon nitride hard mask layer subsequent to exposure to an HCl and germane etchant according to one or more embodiments of the present invention.

FIG. 13 illustrates the phosphorous doped silicon layer of FIG. 11 subsequent to exposure to gaseous HCl and germane in the epitaxial chamber at the low temperature. As shown, a portion of the polysilicon or amorphous silicon layer was etched, wherein about 10 nm of the initial thickness was removed, i.e., from an initial thickness of 24 nm to an etched thickness of 14 nm. In contrast, the phosphorous doped single crystalline silicon was substantially resistant to etch, i.e., the initial thickness was about 26 nm and after exposure to the HCL and germane gaseous mixture was at a thickness of about 24 nm.

Figure 14:
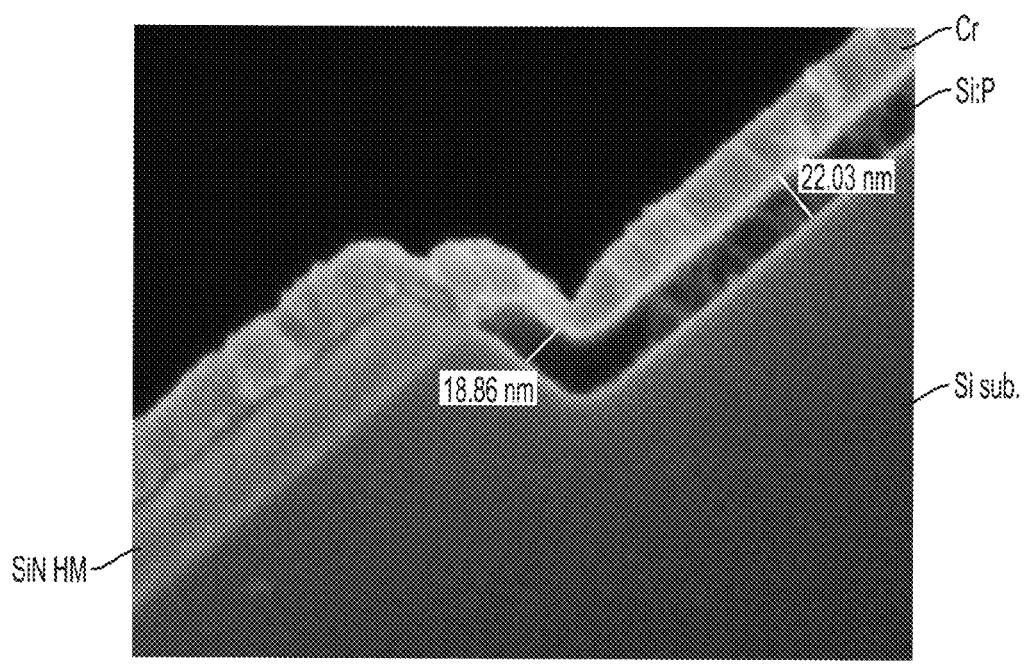
FIG. 14 depicts the phosphorous doped silicon layer of FIG. 11 deposited onto the silicon substrate and a silicon nitride hard mask layer subsequent to exposure to an HCl and germane etchant for a period of time effective to selectively remove the polysilicon/amorphous silicon form the substrate according to one or more embodiments of the present invention

FIG. 14 illustrates the phosphorous doped silicon layer of FIG. 11 subsequent to exposure to prolonged gaseous HCl and germane in the epitaxial chamber at the low temperature. As shown, the polysilicon or amorphous silicon layer overlying the silicon nitride hard mask was completely etched from its initial thickness was removed whereas the phosphorous doped single crystalline silicon was substantially resistant to etch, i.e., the initial thickness was about 26 nm and after the same exposure to the HCL and germane gaseous mixture was at a thickness of about 22 nm. As demonstrated, the selective diffusivity of germanium into the poly/amorphous silicon compared to single crystalline silicon provides a robust low temperature selective epitaxy process for forming the top electrode.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor structure comprising:
    providing a substrate comprising a first surface comprising single crystalline silicon and at least one additional surface comprising a dielectric material;
    epitaxially growing a silicon layer with a dopant at a temperature less than 500° C. on the substrate to form a single crystalline silicon on the first surface and a polysilicon/amorphous silicon on the additional surface, wherein the single crystalline silicon on the first surface and the polysilicon/amorphous silicon comprise a boundary therebetween, wherein a shape of the boundary is multifaceted; and
    exposing the epitaxially grown silicon layer to an etchant comprising HCl and germane at a temperature less than 500° C. to selectively remove the polysilicon/amorphous silicon on the additional surface and form a germanium diffused region on and in an outer surface of the single crystalline silicon formed on the first surface.

2. The method of claim 1, wherein growing the silicon layer with the dopant comprises exposing the substrate to a gaseous mixture of phosphorous containing gas and a silicon containing gas selected from the group consisting of $SiH_4$, $Si_2H_6$, $Si_3H_8$ and $Si_4H_{10}$.

3. The method of claim 1, wherein the first surface is an exposed top surface of a vertically oriented channel region of a vertical finFET structure.

4. The method of claim 1, wherein the single crystalline silicon on the first surface defines a top source or drain region of a vertical finFET structure.

5. The method of claim 1, wherein the growing of the silicon layer with the dopant and the exposing of the grown silicon layer to the etchant is cycled, wherein multiple layers of the germanium diffused region is formed in and on the single crystalline silicon formed on the first surface.

6. The method of claim 1, wherein the dielectric material is an oxide or a nitride.

7. The method of claim 2, wherein the phosphorous containing gas is phosphine.

8. A method of forming a top source or drain region in a VTFET device, the method comprising:

positioning a semiconductor substrate including a partial VTFET structure in an epitaxially deposition chamber, the partial VTFET structure comprising a substrate, a bottom doped source or drain region, a vertically oriented channel region extending from the bottom doped source or drain region, a gate stack over the channel region and between a bottom spacer overlying a portion of the bottom doped source and drain region and a top spacer, wherein a deposition surface of the partial VTFET structure includes a dielectric material and a topmost portion of the channel region;

applying first source gasses for deposition of a material layer to the deposition surface at a temperature of less than 500° C., the first source gases comprising a phosphorous containing gas and a silicon containing gas selected from the group consisting of $SiH_4$, $Si_2H_6$, $Si_3H_8$ and $Si_4H_{10}$, wherein a doped polysilicon/amorphous silicon layer is formed on the dielectric material and a doped single crystalline silicon layer is formed on the exposed topmost portion of the channel region;

applying second source gasses for surface modification and etching, the second source gasses comprising HCl and germane, wherein the surface modification selectively diffuses germanium atoms into a portion of the polysilicon/amorphous silicon to render the germanium atom diffused portion removable upon contact with the HCl etchant so as to selectively remove the portion of the doped polysilicon/amorphous silicon layer relative to the doped single crystalline silicon and form the top source or drain region in the VTFET device.

9. The method of claim 8, wherein the dielectric material is an oxide or a nitride.

10. The method of claim 8, wherein the doped single crystalline silicon formed on the exposed topmost portion of the channel region is multifaceted.

11. The method of claim 8, wherein the doped single crystalline silicon formed on the exposed topmost portion of the channel region is diamond shaped.

12. The method of claim 8, wherein the single crystalline silicon on the first surface defines a top source or drain region of the VTFET.

13. The method of claim 8, further comprising cycling the first and second source gasses to provide multiple cycles of deposition followed by the surface modification and etching, wherein the doped single crystalline silicon includes thin layers of germanium atom diffused regions on and in the doped single crystalline silicon.

14. The method of claim 8, wherein the dielectric is an oxide or a nitride.

15. The method of claim 8, wherein the exposed topmost portion of the channel region extends beyond the dielectric.

16. The method of claim 8, wherein the phosphorous containing gas is phosphine.

* * * * *